United States Patent [19]
Lieurance

[11] Patent Number: 5,583,319
[45] Date of Patent: Dec. 10, 1996

[54] LOW RESISTANCE SUPERCONDUCTOR CABLE SPLICE AND SPLICING METHOD

[76] Inventor: Dennis W. Lieurance, 1053 Honeysuckle Dr., San Marcos, Calif. 92069

[21] Appl. No.: 140,367

[22] Filed: Oct. 21, 1993

[51] Int. Cl.$^6$ ............................ H02G 15/00; H01L 39/00
[52] U.S. Cl. .................... 174/84 R; 174/125.1; 29/599; 29/872; 505/925; 505/926
[58] Field of Search .................... 174/84 R, 94 R, 174/125.1; 29/599, 863, 869, 872, 873; 505/925, 926, 927

[56] References Cited

U.S. PATENT DOCUMENTS

| | | | |
|---|---|---|---|
| 3,453,378 | 7/1969 | McInturff | 174/94 R |
| 3,777,051 | 12/1973 | Ziegler et al. | 174/94 R |
| 4,631,808 | 12/1986 | Jones | 29/599 |
| 4,794,688 | 1/1989 | Wada et al. | 29/599 |
| 5,111,574 | 5/1992 | Smathers | 29/599 |

FOREIGN PATENT DOCUMENTS

| | | | |
|---|---|---|---|
| 0408408 | 11/1967 | Australia | 174/94 R |
| 0005485 | 1/1977 | Japan | 174/94 R |
| 3-208279 | 9/1991 | Japan | 505/925 |

*Primary Examiner*—Hyung S. Sough
*Attorney, Agent, or Firm*—John R. Duncan; Frank D. Gilliam

[57] ABSTRACT

A low resistance splice for electrically connecting the ends of two superconducting cables and a method for making the splice. Two cables formed from superconducting material are positioned in close proximity, either overlapping or axially aligned and extending in opposite directions away from the splice. At least one strand of superconducting material is wrapped over both cables in a pressure relationship assuring good electrical contact between cable ends and strands. Solder is melted and applied to hold the strands against the cables. Where the cables overlap, solder may be used at the overlap interface to add mechanical strength. The strands may be in the form of a helical winding around overlapping cable ends or in the from of a braided tube surrounding and pressed against either overlapping or axially aligned cables. In the axial embodiment, the cables with the strand wrap may be pressed into a slot and the slot filled with solder to hold the cables and strands in position.

7 Claims, 2 Drawing Sheets

5,583,319

LOW RESISTANCE SUPERCONDUCTOR CABLE SPLICE AND SPLICING METHOD

BACKGROUND OF THE INVENTION

This invention relates in general to splices between electrical cables, and, more specifically to a splice and method of splicing for use with superconducting cables.

Electrical cables, being finite in length, often need to be spliced together to form a very long, electrically continuous, cable. With the usual materials, such as copper or aluminum, used at ambient temperatures, the two cables are generally simply mechanically fastened together or soldered together. Typical of the prior art techniques for joining two conductors together are the crimp rings disclosed by Bennett in U.S. Pat. No. 3,231,964, and soldering as described by McIntosh et al in U.S. Pat. No. 3,517,150.

Superconducting cables, however, have physical characteristics making such simple splicing techniques either unworkable or difficult. Superconductors are materials, often metals or ceramics, that lose all resistance when cooled below a critical temperature. Many materials have superconducting capabilities, although most only superconduct at temperatures approaching 0° K. The most practical for use in superconducting magnets and the like are those that superconduct at or near the boiling temperature of liquid helium; typically, Nb-Zr and Nb-Ti alloys and the compound $Nb_3Sn$. The most common method of splicing such superconductors has been the lap splice, where the cable ends are overlapped and soldered together. Such soldered splices exhibit relatively high resistance which can lead to excessive local heating, to the point where the spliced superconductors are raised above the critical superconducting temperature and cease to superconduct.

A number of different methods have been developed in order to connect ends of superconductor cables without interposing a high resistance material, such as solder, between them. Where the cable has multiple strands, simply overlapping the strands of each cable and crimping them together has been proposed by Wada et al. in U.S. Pat. No. 4,794,688. However, this is not effective with bar or other single strand superconductor cables and provides only a mechanical joint which may have insufficient strength for some applications and leaves the superconductor subject to corrosion.

Multi-filament cable ends have been joined by intertwining the superconductor filaments, heating to a diffusion temperature then crimping a sleeve over the connection as described by Smathers in U.S. Pat. No. 5,111,574. This is a complex process which may degrade the superconducting properties and would be difficult to consistently accomplish outside of a laboratory environment.

Jones, in U.S. Pat. No. 4,631,808 places two cable ends in parallel, crimps a sleeve of superconducting material over the ends, then embeds the entire assembly in a conductor. This method, however, is not suitable for a continuous cable to be wound into a coil or the like.

Thus, there is a continuing need for a simple but effective method of splicing ends of superconducting cables together to form a longer cable suitable for winding into magnet coils and the like, where high resistance splices, with the attendant undesirable heating, are avoided and where the splice can be easily made in a factory environment.

SUMMARY OF THE INVENTION

The above noted problems, and others, are overcome by a splice and method of making the splice wherein two superconducting cables, each of which may be formed from a single superconductor or a plurality of strands, are arranged in close proximity or overlapping, with the cables extending in opposite directions from the splice. One or more strands of superconducting material, preferably the same material as in said cable, are brought into pressure contact with a cable end and can be wound in a helical manner along the two overlapping cables. Alternatively, the strands can be in the form of a hollow braid with the cable ends inserted into the braid and the braid pressed against the cable ends. In either case, after installation of the strands, sufficient molten solder is applied over the assembly to maintain the strands in place and add mechanical strength to the splice. Using the overwrapped superconducting strand effectively forms an equipotential surface around the cables to be spliced, thus increasing effective cable to cable contact area.

This splice can be easily made by factory personnel in a factory environment. The splice is relatively thin and conforms to the cable so that the cable can be wound into tightly packed coils or the like without significant interference from the splice.

Thus, it is an object of this invention to provide a low resistance superconducting cable splice. Another object is to provide an easily formed splice that does not require complex equipment or materials and can be accomplished in a factory environment. A further object is to provide a splice that does not significantly interfere with forming the cable into desired configurations, such as magnet coils.

BRIEF DESCRIPTION OF THE DRAWING

Details of the invention, and of certain preferred embodiments thereof, will be further understood upon reference to the drawing, wherein.

DETAILED DESCRIPTION OF PREFERRED EMBODIMENTS

Figure 1:
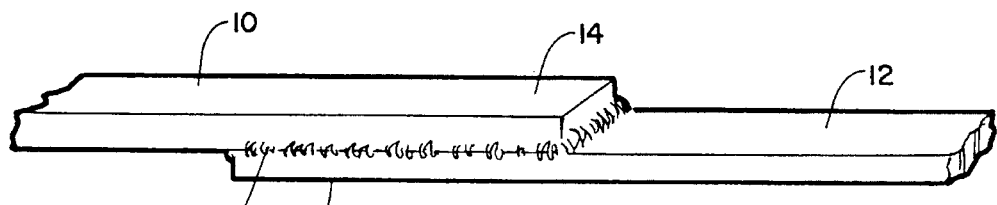
FIG. 1 is a schematic perspective view of a superconductor splice according to the prior art.

FIG. 1 shows a conventional splice according to the prior art, made by overlapping superconducting cables 10 and 12 and bonding the overlapping cable ends 14 and 16 with a solder interlayer 18. Typically, a flux is applied over the mating surfaces of cable ends 14 and 16, the ends are heated and solder applied along the line of contact, with solder melting and flowing into the interface by capillary action. Alternatively, pieces of solder may be placed between the ends prior to heating or layers of solder could be formed on the ends, then the ends sweated together.

While providing acceptable mechanical strength, the solder provides a resistive barrier to current flowing between cables 10 and 12. A very long overlap is often required to reduce the resistance effects of the solder layer. Disadvantageous localized heating will occur, which must be rapidly and efficiently carried away by the cooling system to prevent the splice from heating above the superconducting temperature (going normal), possibly catastrophically. While two flat, single strand, cables 10 and 12 are shown for clarity of illustration, any suitable cable configuration, such as multiple thin strands, may be used.

Figure 2:
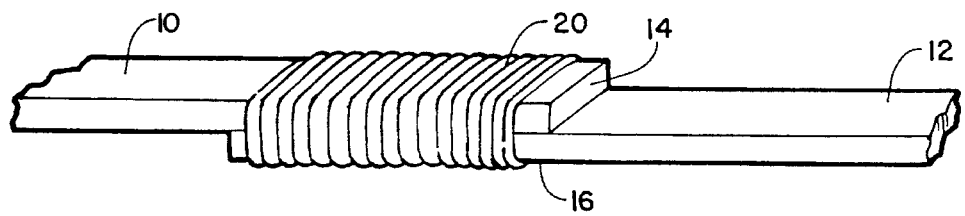
FIG. 2 is a schematic perspective view of a splice using a helical superconductor strand wrap.

The problems of the prior art methods are greatly diminished by tightly wrapping one or more strands 20 of superconducting material around the overlapping cable ends 14 and 16 as seen in FIG. 2. Once the strands are in place, the strands and ends are fluxed and soldered to hold the ends together and the strands 20 to the ends. Of course, solder may be applied to the ends in advance of strand wrapping, or the ends could be fluxed before wrapping so that a single soldering step will bond the ends together and bond the strands 20 to the ends. Strands 20 may be applied in any suitable manner, with a winding machine or by hand as desired.

The strands 20 may be abutting or spaced and multiple layers could be applied if desired, although a single substantially abutting helical application is preferred for most effective conduction, efficient use of strand material and a less bulky splice. When wound, tight contact is optimum, so that generally ends of the strands will be under tension during soldering, then excess strand material can be clipped away.

Figure 3:
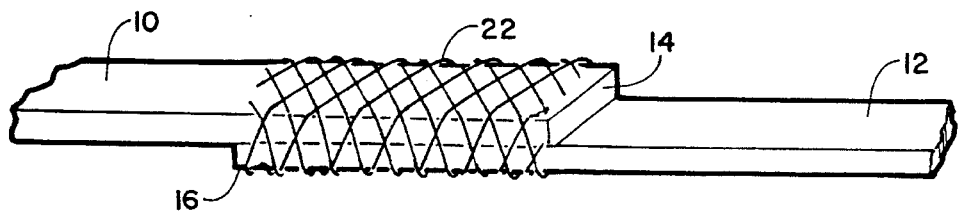
FIG. 3 is a schematic perspective view of an embodiment similar to that of FIG. 2 but using a braided strand wrap.

FIG. 3 shows another embodiment of the invention, generally similar to that shown in FIG. 2 but using a different arrangement of strands 20. Here a hollow braid 22 of superconductor strands is formed and the two ends 14 and 16 are slipped into the braid. Braid 22 is either pressed against ends 14 and 16, or the ends of the braid are pulled away from each other so the opening through the braid is reduced in diameter and brought into tight contact with ends 14 and 16, in the manner of the braided toy called a "Chinese finger trap". After the parts are assembled, and with braid 22 in tight contact with the ends, the assembly is soldered as described above, to hold the braid in position and supply mechanical strength to the splice.

Figure 4:
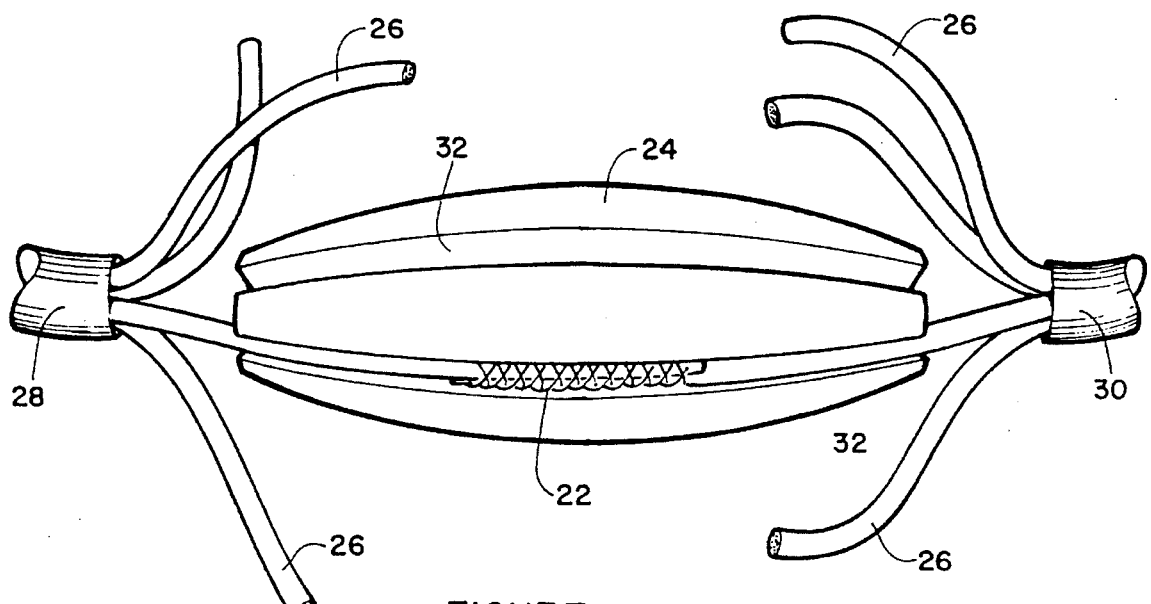
FIG. 4 is a schematic perspective view of an embodiment in which an overlapping spliced cable is pressed into a channel.
Figure 5:
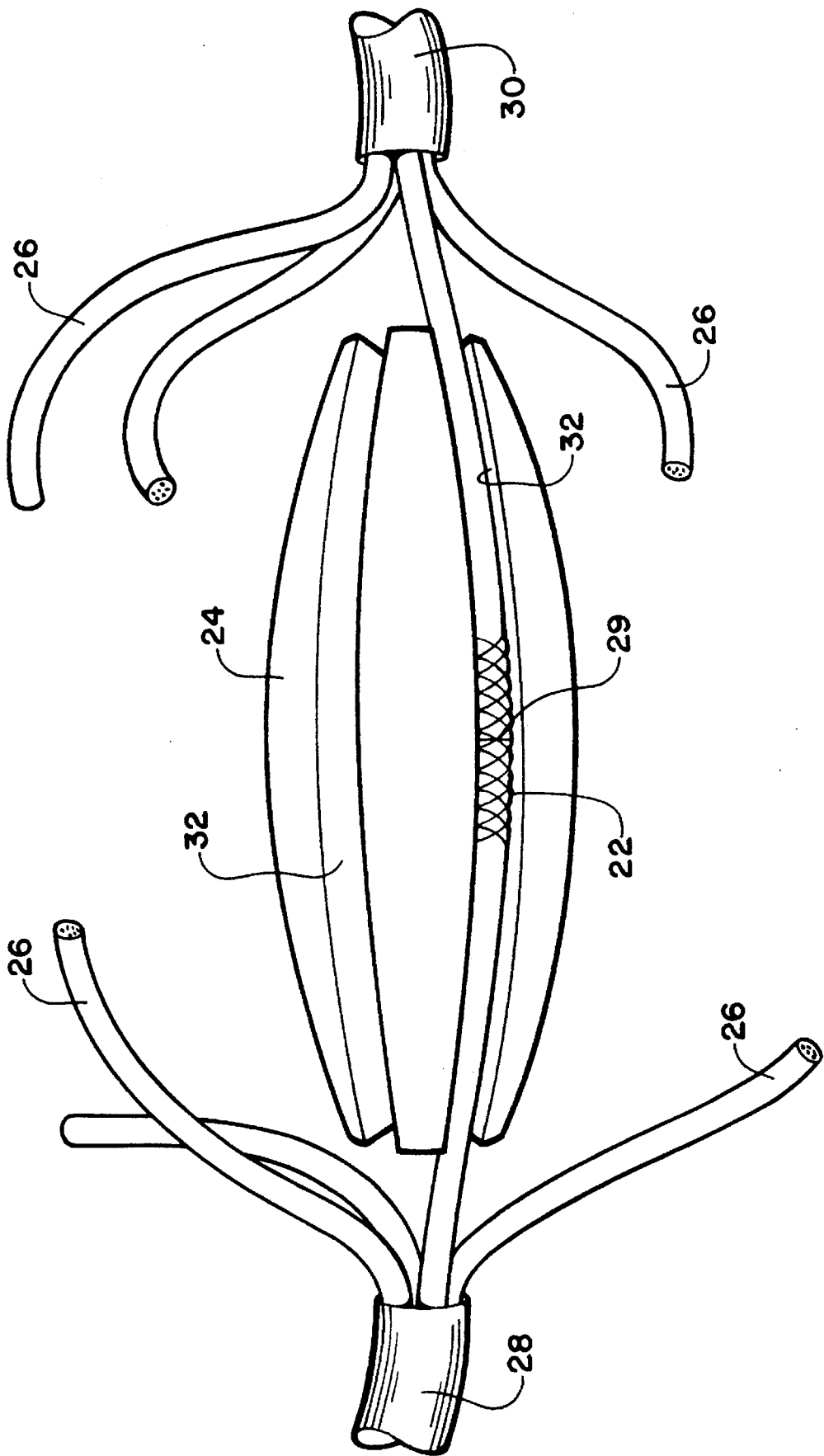
FIG. 5 is a schematic perspective view of an embodiment as shown in FIG. 4 but with abutting cable ends.

FIG. 4 shows a schematic representation of another embodiment particularly suitable for used with a superconductor laid up from plural subcables, with each subcable containing a plurality of spirally arranged strands and the subcables spirally arranged in the manner of a conventional rope. A body 24, generally cylindrical with reduced end diameter, has a plurality of surface grooves or channels 32 corresponding in number and size to rope subcables 26 unlaid from superconductor cables 28 and 30. A superconductor strand braid of the sort detailed above is placed over the ends of each pair of opposite subcables 28 and 30, with the ends of those subcables substantially abutting. One set of subcable ends is shown inserted into a braid 22 and pressed into a channel. Once all of the cable subcables are inserted in a braided tube and pressed into a channel, the channels are filled with solder to hold the assemblies in the channels and provide a high degree of mechanical strength. Channels 32 are sized to tightly hold the braid and subcables, forcing the braid into excellent electrical contact with the subcables. The resulting splice has very low electrical resistance, high strength and a smooth shape permitting winding the cable into coils or the like. FIG. 4 illustrates subcables 26 in an overlapping relationship while FIG. 5 illustrates subcables 26 having ends abutting, in contact along a contact plane 29.

Any suitable metallic superconductor may be used for the cable and strand, either helical or braided. While different superconductors could be used, for best results the same superconductor should be used for both the cable and the overlying strands. Typical superconductors include Nb-Zr and Nb-Ti alloys, and $Nb_3Sn$. Any suitable solder may be used, such as lead-tin or silver-tin solders.

Other applications, variations and ramifications of this invention will occur to those skilled in the art upon reading this disclosure. Those are intended to be included within the scope of this invention, as defined in the appended claims.

I claim:

1. A low resistance splice for superconductor cables which comprises:

at least two rope-like cables, each made up of plural subcables, formed from superconducting material;

ends of said subcables positioned in close, axially abutting, proximity with the subcables extending away from a splice location in opposite directions;

a plurality of strands of superconducting material in the form of a hollow braid surrounding said ends in pressure contact with said ends, said cables and strands formed from substantially the same superconducting material;

said subcables and surrounding braid positioned in channels in a body; and sufficient solder applied over said strands and ends to maintain said strands in contact with said ends and at least partially fill said channels with solder.

2. A low resistance splice for multi-subcable superconductor cables which comprises:

two cables formed from multiple, rope-like, subcables of metallic superconducting strand material;

an elongated body having a plurality of surface channels;

the number of channels equaling the number of said subcables;

said subcables from each of said cables having subcable ends positioned in an abutting relationship;

a hollow braid of superconducting strands surrounding each pair of said abutting subcable ends;

each set of said braid and said subcable ends positioned in one of said channels; and the remaining space in each of said channels substantially filled with solder.

3. The low resistance splice for superconductor cables according to claim 2 wherein said cables and said strands are all formed from the same superconductor composition.

4. The low resistance splice between ends of two superconductor cables which comprises the steps of:

providing two cable ends each formed from multiple, rope-like, subcables of metallic superconducting material;

providing an elongated body having a plurality of surface channels, the number of channels equaling the number of said subcables;

sliding a hollow braid of superconducting strands over a first subcable on a first cable end;

inserting a second subcable on a second cable end into said hollow braid to form an abutting and co-axial relationship with said first subcable;

positioning the resulting assembly of subcable ends and braid in one of said channels; and filling the remaining space in said one channel with solder.

5. The method according to claim 4 including repeating said steps of inserting and positioning with the remaining subcables and channels, and filling all of the channels with solder.

6. The method according to claim 4 wherein said subcables and said braid are formed from the same superconductor material.

7. The method according to claim 4 including the step after said inserting step of pulling the ends of said braid away from each other to reduce the inside diameter of said braid and bring said braid into tight engagement with said subcables.

* * * * *